United States Patent [19]
Haga et al.

[11] Patent Number: 5,811,876
[45] Date of Patent: Sep. 22, 1998

[54] SEMICONDUCTOR DEVICE WITH FILM CARRIER PACKAGE STRUCTURE

[75] Inventors: Akira Haga; Katsunobu Suzuki, both of Tokyo, Japan

[73] Assignee: NEC Corporation, Japan

[21] Appl. No.: 636,864

[22] Filed: Apr. 23, 1996

[30] Foreign Application Priority Data

Apr. 27, 1995 [JP] Japan .................................. 7-103755

[51] Int. Cl.⁶ .................. H01L 23/495; H01L 23/10; H01L 23/34
[52] U.S. Cl. .................. 257/675; 257/668; 257/706; 257/707
[58] Field of Search .................. 257/668, 675, 257/706, 707

[56] References Cited

U.S. PATENT DOCUMENTS

| 5,227,663 | 7/1993 | Patil et al. | 257/706 |
| 5,386,342 | 1/1995 | Rostoker | 257/668 |
| 5,561,323 | 10/1996 | Andros et al. | 257/707 |

FOREIGN PATENT DOCUMENTS

| 4129160 | 5/1992 | Germany | 257/675 |
| WO7900302 | 5/1979 | WIPO | 257/706 |

OTHER PUBLICATIONS

Flat Package Using Three Layer Film, IBM TDB vol. 30, No. 8, Jan. 1989, p. 119.

*Primary Examiner*—Teresa M. Arroyo

[57] ABSTRACT

A lead portion of a film carrier package is sandwiched between a slanted area of a radiation plate and a slanted area of a press frame. The radiation plate has the structures that the front surface thereof has the flat area at the central unit parallel to the back surface, and has at the peripheral portion the slanted area increasing or decreasing the thickness toward the outer periphery of the radiation plate. The film carrier package has the structures that a window is formed at the central area thereof, having a size smaller than the flat area, a slit is formed in an insulating film inside of the interconnection pattern by 1 to 5 mm, and the area surrounded by slits at the four sides is larger than the outer dimension of the radiation plate. The slanted area of the radiation plate engages with the slanted area of the press frame. The film carrier package with the radiation plate can be assembled in a short period while ensuring a low heat resistance.

7 Claims, 12 Drawing Sheets

SEMICONDUCTOR DEVICE WITH FILM CARRIER PACKAGE STRUCTURE

BACKGROUND OF THE INVENTION (1) Field of the Invention

The present invention relates to a semiconductor device, and more particularly to a film carrier package for wire bonding a semiconductor chip and interconnection patterns.

(2) Description of the Related Art

In order to assist the understanding of the invention, conventional semiconductor devices of the kind to which the present invention relates are explained first.

As a first conventional technique, a method for fabricating a semiconductor device using a film carrier package will be described with reference to FIGS. 1A to 1C. In a mount process illustrated in FIG. 1A, after a mount material 62 is coated on, or attached to, the central area of an insulating film 64 of a film carrier package 60, an LSI 61 is fixedly mounted thereat. Next, in a bonding process illustrated in FIG. 1B, each interconnection pattern 63 exposed in a hole 65 is bonded to a corresponding electrode pad of the LSI 61 by a wire 66. Thereafter, in a sealing process illustrated in FIG. 1C, resin 67 is coated over the LSI 61, wires 66 and holes 65 to seal them, thereby completing a semiconductor device.

FIG. 2 shows the mount state of the semiconductor device wherein the LSI chip is mounted on the film carrier package as described above. Each conductive interconnection (not shown) on the surface of a printed circuit board 9 is connected to an outer edge of a corresponding interconnection pattern 63 by solder 68. Solder resist 69 is formed in advance on the surface of the printed circuit board 9 so that portions other than the outer edges of the interconnection patterns are electrically connected to the conductive interconnection on the printed circuit board 9.

This conventional technique can be applied to the LSI 61 whose heat dissipation is small. Therefore, a radiation plate is not attached to the LSI 61. In the case where a radiation plate is not used, a process of bending the interconnection patterns 63, i.e., leads, is not necessary so that the LSI 61 is directly mounted on the printed circuit board 9. However, if the LSI 61 has a large heat dissipation and a radiation plate is necessary, such a semiconductor device cannot be used.

As a second conventional technique, a method of assembling a film carrier package requiring provision of a radiation plate and a shaping process will be described with reference to FIGS. 3A and 3B. As shown in FIG. 3A, an LSI 72 is fixedly mounted on the central area of a film carrier package by a mount material 76, the package having an insulating film 71 on its bottom surface (back surface) and interconnection patterns 75 on its top surface (front surface). Each interconnection pattern 75 is electrically bonded by a wire 73 to a corresponding pad of the LSI 72. The interconnection patterns 75, wires 73 and the LSI 72 are sealed by resin 70. Next, as shown in FIG. 3B, a radiation plate 74 having a trapezoidal cross section is fixed to the insulation film 71, and the outer edge portions of the interconnection patterns 75 are bent to be in parallel with a printed circuit.

The reasons for performing this shaping process are because of a necessity of a so-called face-down mount in which the resin 70 faces the printed circuit board to allow the heatsink (not shown) to be mounted on the radiation plate 74 and of a necessity of making the ends of the interconnection patterns 75 reach the printed circuit board by bending the periphery portions of the radiation plate 74.

As a third conventional technique, processes such as a process of mounting a semiconductor chip having bumps will be described with reference to FIGS. 4A, 4B and 4C illustrating a sequence of the processes. As shown in FIG. 4A, a number of projected electrodes, i.e., bumps 78 are formed on the surface of an LSI 79 by a plating method, a gold ball bonding method, or other methods. On the bottom of the LSI 79, a radiation plate 81 is fixedly mounted by using a mount material 80. A Tape Automated Bonding (TAB) tape 76 having a plurality of leads 77 thereon is connected to the LSI 79 equipped with the radiation plate 81 by an Inner Lead Bonding (ILB) process. Specifically, after the TAB tape 76 is aligned with the LSI 79 having the radiation plate 81, the leads 77 of the TAB tape 76 and the bumps 78 on the LSI 79 are electrically connected together by a gang bonding method or a single point bonding method, as shown in FIG. 4B.

Thereafter, as shown in FIG. 4C, resin 83 is potted from a nozzle 82 to fully cover the LSI 79.

The mount state of the semiconductor device of the third conventional technique is a face-down mount as illustrated in the cross sectional view of FIG. 5. This figure is referenced from Japanese Patent Application Kokai Publication No. Sho 63-293928. Specifically, on the surface of a radiation plate 85 opposite to the surface on which a pellet 89 is fixed, a pressure member 84 is fixedly mounted. An end of the pressure member 84 is fixed to a printed circuit board 89 by a bolt. Leads 86 are bent downward at the position of a support ring 87, and bent in a reverse direction along the surfaces of pads 88. Bending the leads 86 is required to cover at least the thickness of the potted resin 90.

With the first conventional technique, since a heat radiation plate for dissipating heat generated by a semiconductor chip is not used, this technique is limited only to low power consumption type semiconductor devices.

With the second conventional technique, processes of mounting a radiation plate and bending leads are additionally used so that work time cannot be shortened and manufacturing costs cannot be reduced either. Unlike in the case of TAB leads, wire bonding for a film carrier package requires a die attachment portion for fixing a semiconductor chip, because the chip cannot be mechanically held in position only with wires. Provision of a die attachment portion made of an insulating film hinders thermal dissipation. A thermal resistance of this insulating film is about 5° C./W.

With the third conventional technique and its mount technique, an additional process of bending leads is required. The flatness of leads after shaping leads without an insulating film which connects adjacent leads, is required to be as highly precise as ±0.05 mm as in a Quad Flat Package (QFP). Even if an insulating film for connecting the adjacent leads is present, the flatness of leads is required to be ±0.1 mm or smaller. Thus, it is a problem that the requirements of precision are severe.

SUMMARY OF THE INVENTION

In view of the above problems, the present invention has objects as follows: (1) allowing a semiconductor chip with relatively large power consumption to be accommodated; (2) providing a radiation plate to enhance heat dissipation; (3) not inserting a large heat resistance material such as an insulating film between a semiconductor chip and a radiation plate; (4) dispensing with a dedicated process of bending interconnection patterns; (5) shortening work time and reducing manufacturing costs; and (6) not requiring a high mechanical precision such as flatness of the leads.

According to an aspect of the invention, there is provided a semiconductor device comprising:

a semiconductor chip;

a radiation plate to which the semiconductor chip is directly fixed at a generally central area thereof;

an insulating film having a window at a portion corresponding to the central area of the radiation plate;

a number of interconnection patterns provided on a surface of the insulating film at a portion except the window, the interconnection patterns being connected to the semiconductor chip by wires;

an insulation press frame fixed at least to the interconnection patterns, the press frame having a surface facing and engaging with a surface of the radiation plate at a peripheral area thereof; and a sealing resin covering the semiconductor chip, the wires and parts of the interconnection patterns.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the accompanying drawings.

Figure 1A:
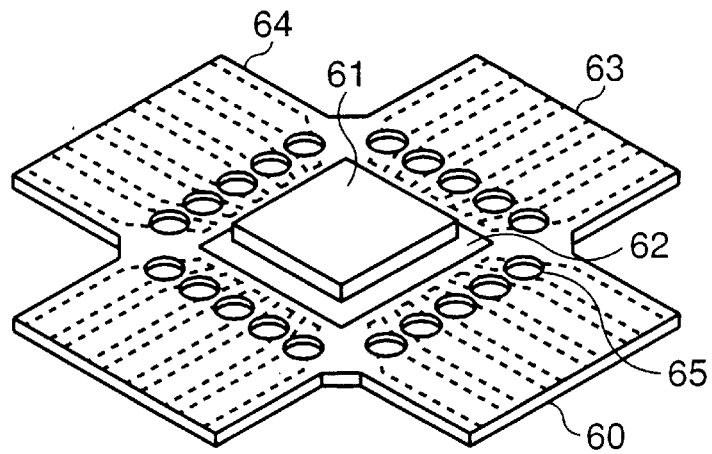
FIGS. 1A, 1B and 1C are perspective views respectively illustrating a mount process, a bonding process and a sealing process according to a first conventional technique.
Figure 1B:
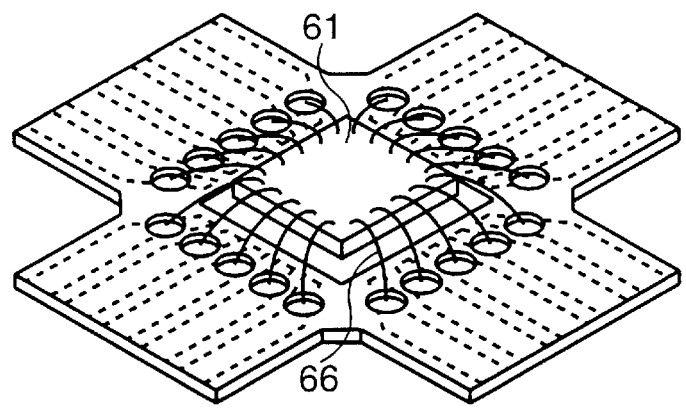
Figure 1C:
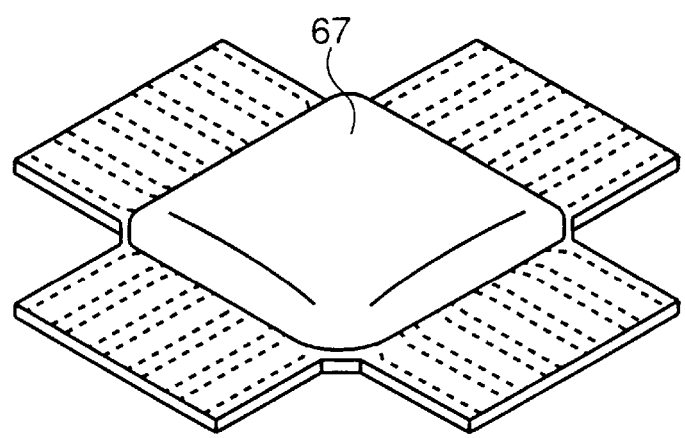
Figure 2:
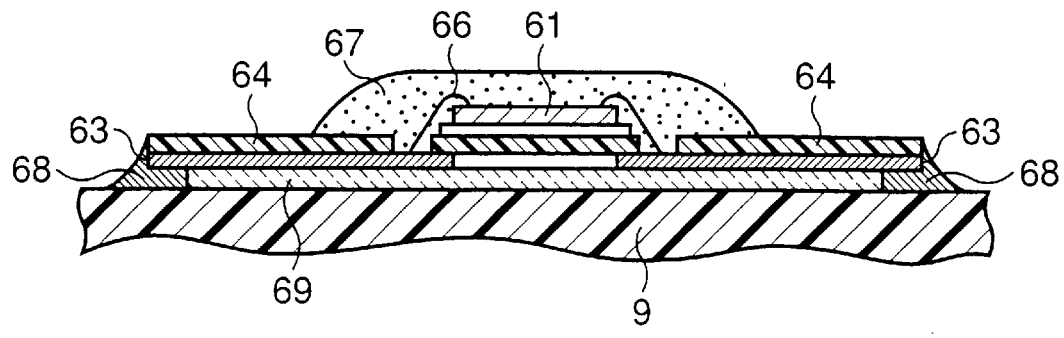
FIG. 2 is a cross sectional view showing a mount state of a semiconductor device of the first conventional technique.
Figure 3A:
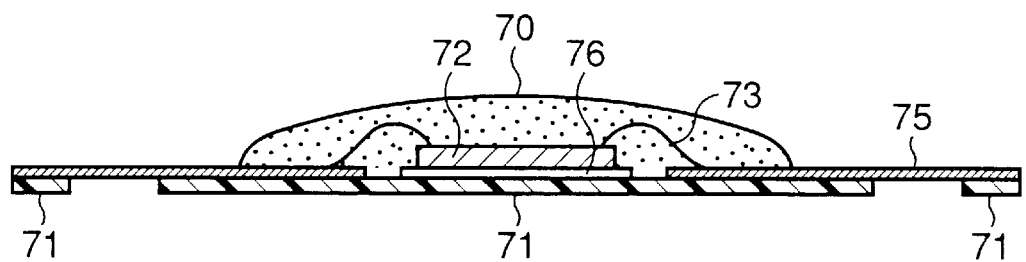
FIGS. 3A and 3B are cross sectional views illustrating a sequence of a process of assembling a radiation plate of a semiconductor device according to a second conventional technique.
Figure 3B:
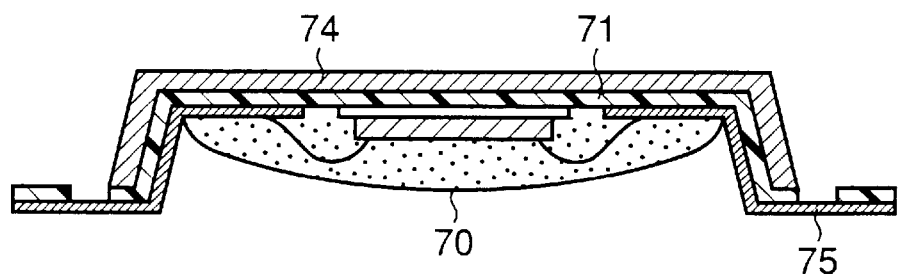
Figure 4A:
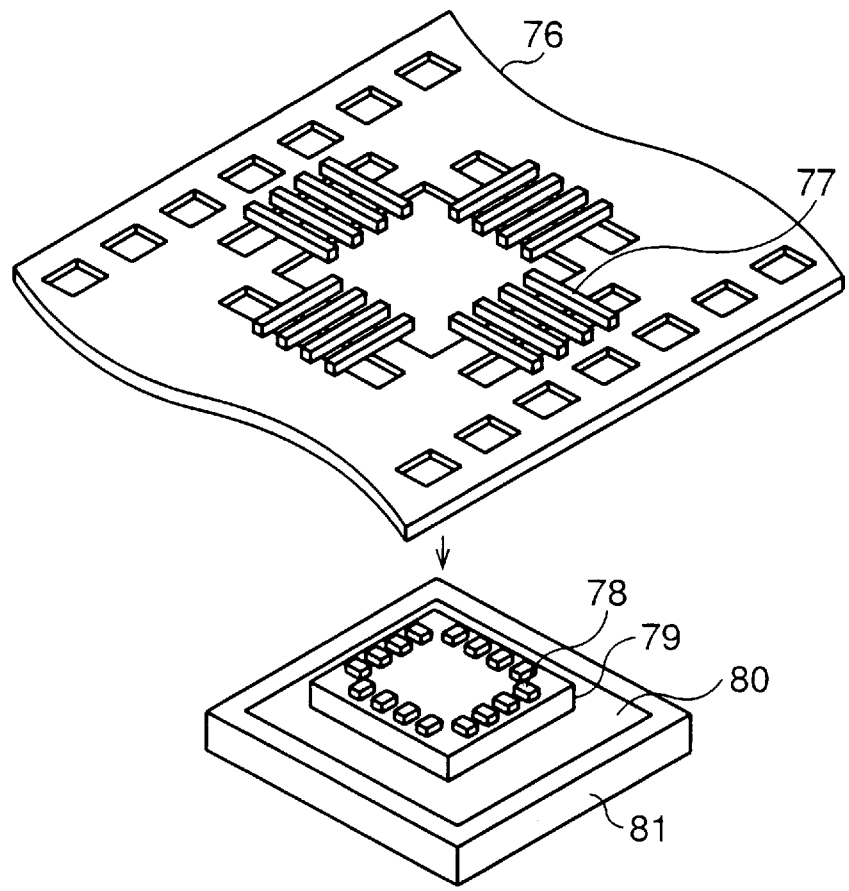
FIGS. 4A, 4B and 4C are perspective views illustrating a sequence of a process of assembling and a process of sealing a film carrier package according to a third conventional technique.
Figure 4B:
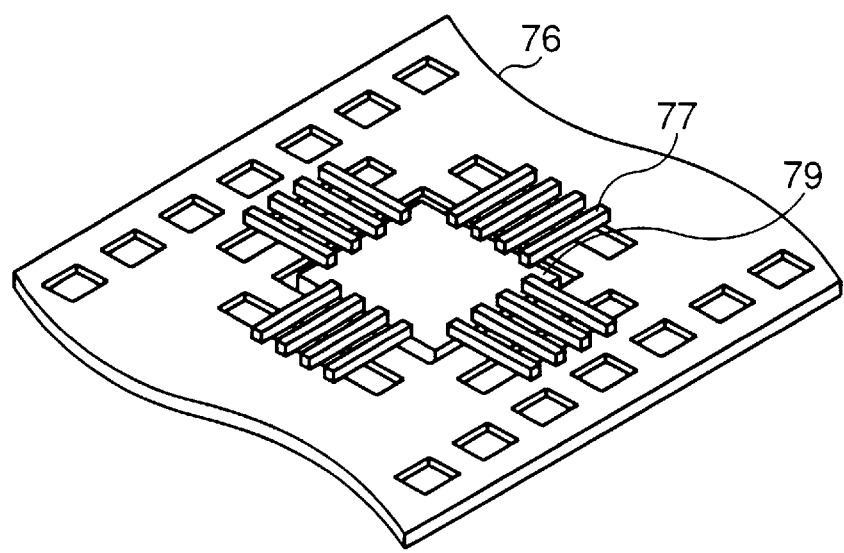
Figure 4C:
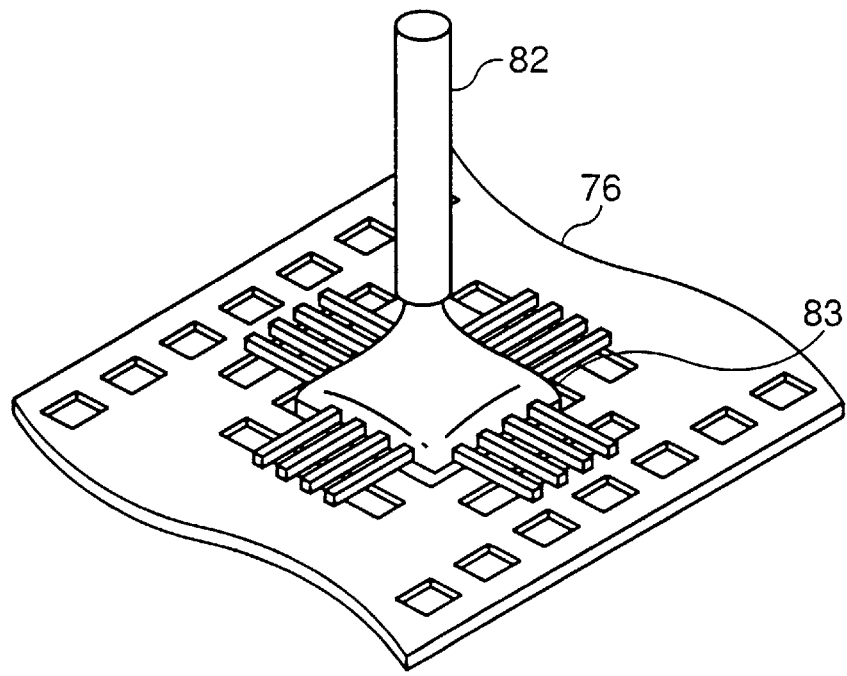
Figure 5:
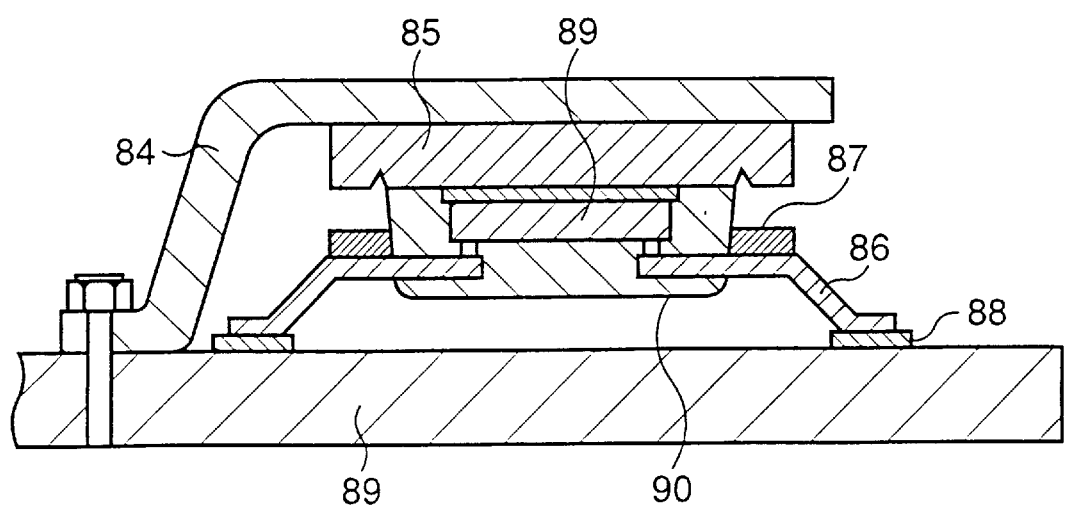
FIG. 5 is a cross sectional view illustrating a conventional mount technique.
Figure 6A:
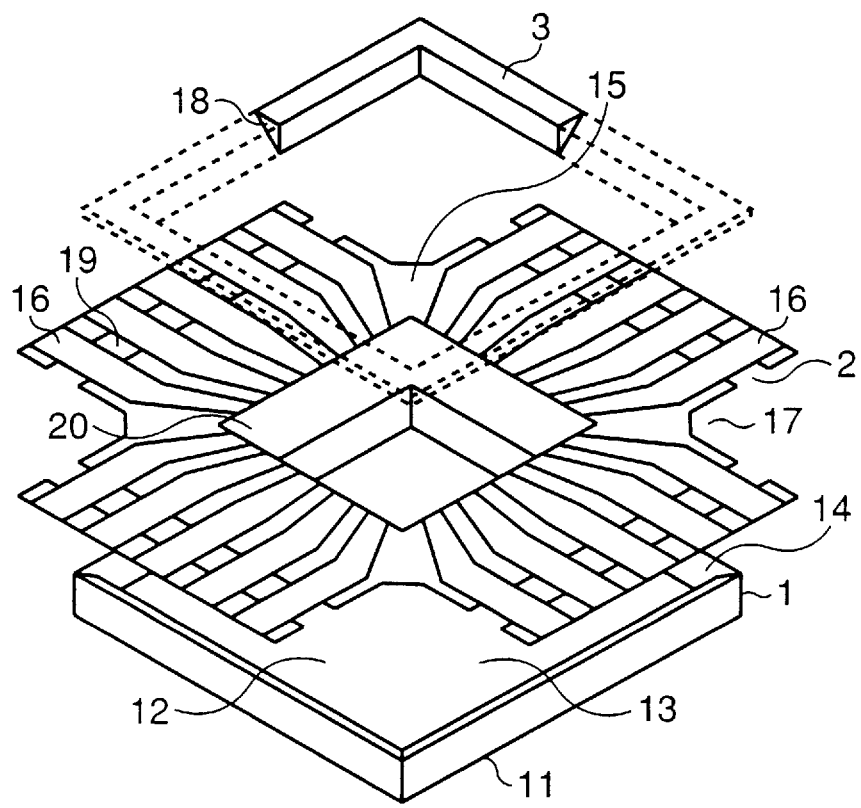
FIGS. 6A and 6B are perspective views showing a film carrier package before and after assemblage according to a first embodiment of the invention.

FIG. 6A is a perspective view of a semiconductor device in a disassembled state according to the first embodiment of the invention. The semiconductor device of this embodiment has a radiation plate 1, a film carrier package 2, a press frame 3, and a semiconductor chip (not shown).

In this embodiment, the radiation plate 1 is made of, for example, aluminum (Al) alloy. Other materials such as ceramic with a high thermal conductivity, and copper with gold plated may also be used. The bottom 11 of the square radiation plate 1 is flat over the whole surface. The top surface 12 of the radiation plate 1 has a flat area 13. At the peripheral areas of the four sides of the radiation plate 1, there are provided four slanted portions 14 the thickness of each of which linearly increases outwardly. It is preferable that the angle of the slanted portions 14 be set to an angle of about 45 degrees to about 10 degrees from the viewpoint of various conditions to be described later.

The film carrier package 2 has an insulating film 15 made of, for example, polyimide, and interconnection patterns 16 with a regular intervals therebetween provided on the surface of the insulating film 15. The interconnection pattern 16 is made of, for example, a copper (Cu) wire plated with nickel (Ni) and further plated with gold (Au).

Although five interconnection patterns 16 are shown at each side of the square window, crossing each side, there is no limit to the number of interconnection patterns. In the actual device, thirty patterns per one side (totally one hundred and twenty patterns at four sides), seventy six patterns per one side (totally three hundreds and four patterns at four sides), or in some case one hundred or more patterns per one side, may be formed.

The interconnection pattern 16 is constituted by a central part with a square window 20 and a peripheral part connecting between the adjacent outer ends of the pattern. The four inner ends of the central part defines the square window 20. Although a contour of the outer ends of the patterns 16 is generally a square, a cut-out portion is formed at each corner so that no misalignment occurs when the film carrier package 2 is to be engaged with the press frame 3. The central part is required for continuously connecting together the inner end and central portion of the interconnection pattern 16, and for avoiding electrical contact with the radiation plate 1.

The square window 20 has a dimension slightly shorter at each side than that of the flat area 13 of the radiation plate 1, and a semiconductor chip (not shown) such as a Large Scale Integrated (LSI) circuit is fitted into the window 20.

The peripheral part of the insulating film 15 is a stripe of about 1 mm to 5 mm wide, and a slit 19 of about 1 mm to 5 mm wide is formed at the area between the peripheral part and the central part. No insulating film exists at the slit 19. A contour of the outer ends of the central part surrounded by the slits 19 is set larger than the outer dimension of the radiation plate 1. . . . [26]

The press frame 3 is made of insulating synthetic resin or ceramic, and the outer side wall is a slanted area 18 which is engaged with the slanted area 14 of the radiation plate 1.

Figure 6B:
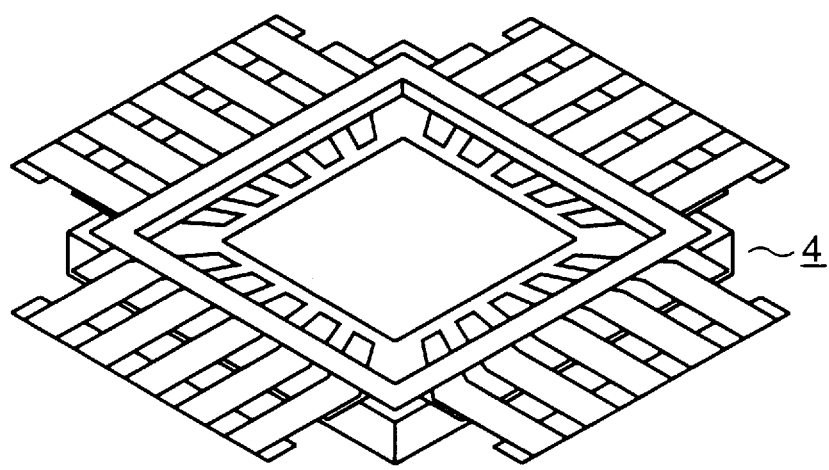

The radiation plate 1 and the film carrier package 2 are set concentric, with the front surface 12 of the radiation plate 1 facing the insulating film 15 of the film carrier package 2. Then, the press frame 3 is pushed toward the film carrier package 2 so that both the slanted areas 14 and 18 respectively of the radiation plate 1 and the press frame 3 are engaged with each other with the film carrier package 2 being sandwiched therebetween, as shown in FIG. 6B. A method of assembling a film carrier package 4 with a radiation plate 1 will be later described. The radiation plate 1, film carrier package 2 and press frame 3 are coupled together by using thermosetting adhesive agent (not shown).

Although not shown in FIG. 6B, the interconnection patterns 16 of the package 4 with the radiation plate are inclined upward in conformity with the slanted areas 14 and 18.

A semiconductor chip is fixed to the package 4, and electrodes on the surface of the chip are wire bonded to the interconnection patterns and, thereafter, resin is coated to seal them therein and complete a semiconductor device. These processes will be later described, and so these elements are not shown here.

The features of the radiation plate 1 of this semiconductor device reside in the structures that the back surface 11 is flat over the whole area, the front surface 12 has the flat area at the central part parallel to the back surface, and has at its peripheral portions the slanted areas each increasing the thickness toward the outer periphery of the radiation plate 1.

The features of the radiation plate 1 are in the structure of the slanted area whose thickness at the peripheral part linearly increases toward the outer periphery of the radiation plate 1, and in the setting of the angle of the slanted area 14 in the range from about 10 degrees to about 45 degrees.

The radiation plate 1 of the semiconductor device is characterized in that it is made of Al based alloy, Cu or Cu alloy (inclusive of Cu/W and Cu/Mo), Fe—Ni based alloy, or the like.

The features of the film carrier package 2 of the semiconductor device reside in the structures that the insulating film 15 is made of thermosetting resin such as polyimide, polyimide based material and epoxy, and the wiring pattern 16 is made of Cu or Cu based alloy with Ni plated and further Au plated.

The features of the film carrier package 2 of the semiconductor device reside in that the thickness of the insulating film 15 is set to 10 to 200 $\mu$m and the thickness of the interconnection pattern 16 is set to 9 to 200 $\mu$m.

In the above semiconductor device, the press frame 3 is characterized in that it is made of thermosetting resin or ceramic material such as $Al_2O_3$ and AlN.

Another feature is the sandwich structure wherein the film carrier package 2 is sandwiched between the slanted area 14 of the radiation plate 1 and the slanted area 18 of the press frame 3.

Figure 7A:
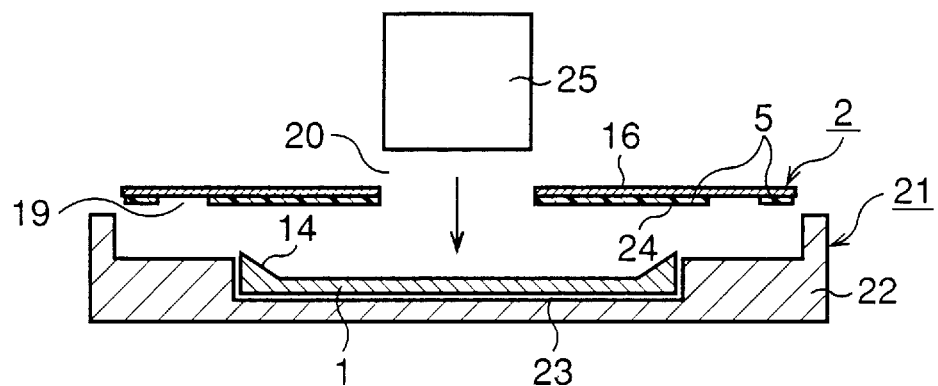
FIGS. 7A to 7D are cross sectional views illustrating a sequence of an assembly process of the film carrier package of the first embodiment.

A method of assembling a film carrier package with a radiation plate of the first embodiment according to the invention will be described with reference to the cross sectional views of FIGS. 7A to 7D. As shown in FIG. 7A, the radiation plate 1 and the film carrier package 2 of a semiconductor device shown in FIG. 6A are prepared.

A guide 21 has a recess 23 formed at the central area, the radiation plate 1 being fitted in the recess 23 to set it at a predetermined position. An edge 22 is also formed at the outer edge portions of the guide 21 so that the film carrier package 2 is set in place.

Such a guide 21 is fixed generally horizontally. Next, the radiation plate 1 and package 2 are set at the predetermined positions. The radiation plate 1 directs its front surface 12 upward, and the package 2 directs its interconnection patterns 16 upward and its insulating film 15 downward. A thin adhesive layer 24 is formed on the insulating film 15. The package 2 is fitted in the edge 22 of the guide 21, with the adhesive layer 24 being directed downward. In this state, a cylinder 25 having the same cross section as the window 20 abuts on the radiation plate 1. It is necessary for the cylinder 25 to smoothly move in the window 20. However, it is preferable that a clearance of 0.05 mm or smaller be provided in order not to generate positional misalignment.

Figure 7B:
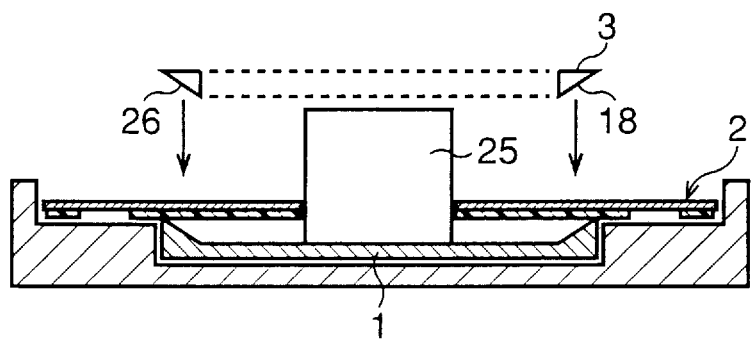

Next, as shown in FIG. 7B, the slanted area 18 of the press frame 3 with an adhesive layer 26 being formed on the surface thereof is engaged with the slanted area 14 of the radiation plate 1, with the package 2 being interposed therebetween. In this case, a misalignment of the press frame 3 is corrected in a self-alignment manner along the slanted area 14 of the press frame 3.

Figure 7C:
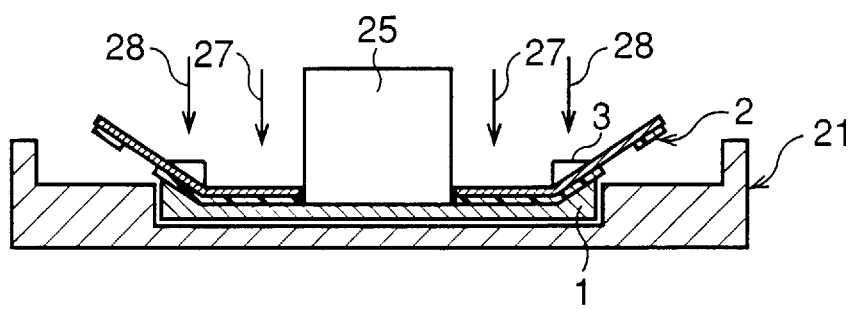

Next, as shown in FIG. 7C, the press frame 3 and the flat area of the package 2 are pressed at a predetermined pressure in the directions indicated by arrows 27 and 28.

A pressure in the direction indicated by the arrow 27 is applied by using a film pressure plunger which moves up and down following the motion of the cylinder 25. A pressure plunger which moves up and down following the motion of the film pressure plunger is used for pressing the press frame 3. Namely, in addition to the cylinder 25, dedicated plungers separately moving up and down are used. If the adhesive layers 24 and 26 are thermosetting adhesive, they are heated and thermally hardened while maintaining a pressed state. In the above manner, the radiation plate 1, the film carrier package 2 and the press frame 3 are assembled together.

Figure 7D:
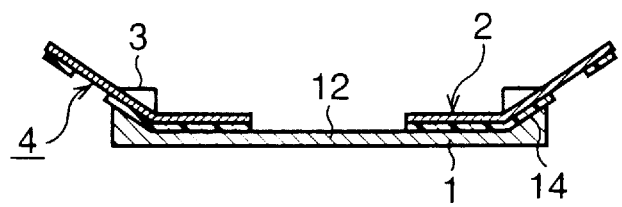

As shown in FIG. 7D, after the package 4 is dismounted from the guide 21, the interconnection patterns 16 are shaped in a predetermined configuration in conformity with the front surface 12 and slanted area 14 of the radiation plate 1.

With the above assembly method, after the slanted surface of the package 2 is formed, the flat surface thereof is formed. The slanted surface may be formed after the formation of the flat surface, or both the surfaces may be formed at the same time. In these processes, it is preferable to form a cut-away portion at the corner 17 as shown in FIG. 6A from the viewpoint of high precision assembly.

As described above, this embodiment features in that the step of forming an adhesive layer, the step of aligning positions, and the step of engaging the slanted areas together are performed in the sequence described above. In the adhesive layer forming step, thermosetting adhesive is coated either on the front surface of the radiation plate or on the insulating film of the film carrier package, or thermosetting adhesive is coated on the insulating film of the film carrier package. In the position aligning step, the positions of the radiation plate and the film carrier package are aligned, with the front surface of the radiation plate being directed to the insulating film of the film carrier package. In the engaging step, the slanted area of the radiation plate at the peripheral area thereof engages with the slanted area of the press frame, while being pressed and heated.

Next, a method of assembling a semiconductor device of the first embodiment of the invention will be described with reference to FIGS. 8A to 8C. At the mount process illustrated in FIG. 8A, a semiconductor chip such as an LSI 6 is fixed to the surface 12 of the radiation plate 1, shown in FIG. 6B, that is exposed in the window 20 of the film carrier package, by using a mount material 5. On the main surface of the semiconductor chip, a number of electrodes (pads) are formed at the peripheral area thereof.

Figure 8A:
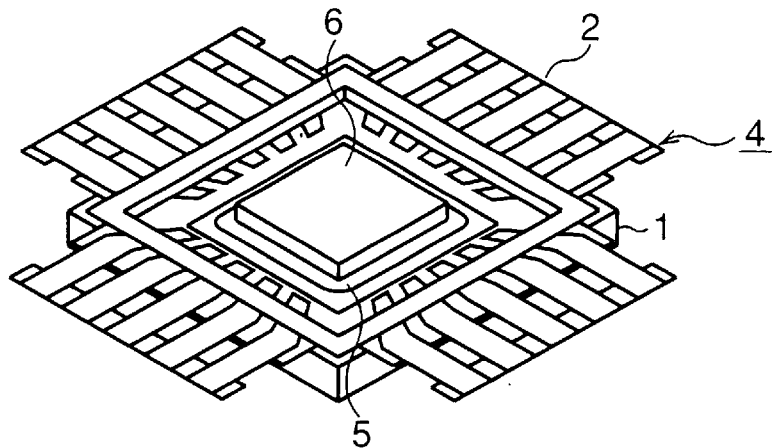
FIGS. 8A, 8B and 8C are perspective views illustrating a mount process, a bonding process and a sealing process of the first embodiment.
Figure 8B:
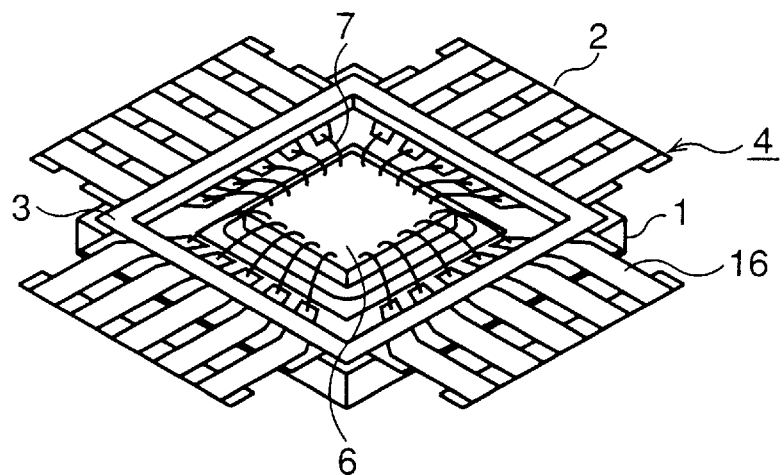

Next, at the bonding process illustrated in FIG. 8B, the pads of the LSI 6 and the inner ends of the interconnection patterns 16 are electrically connected by gold or aluminum wires 7.

Figure 9A:
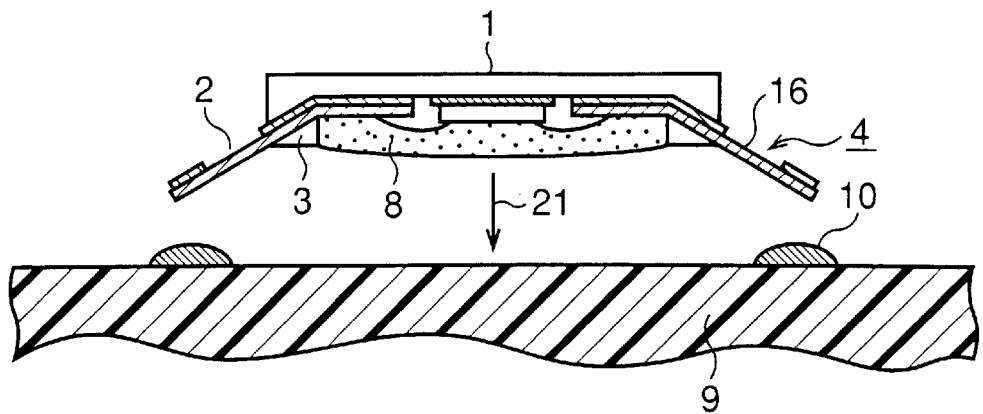
FIGS. 9A, 9B and 9C are cross sectional views illustrating a sequence of a mount process of a semiconductor device of the first embodiment.
Figure 9B:
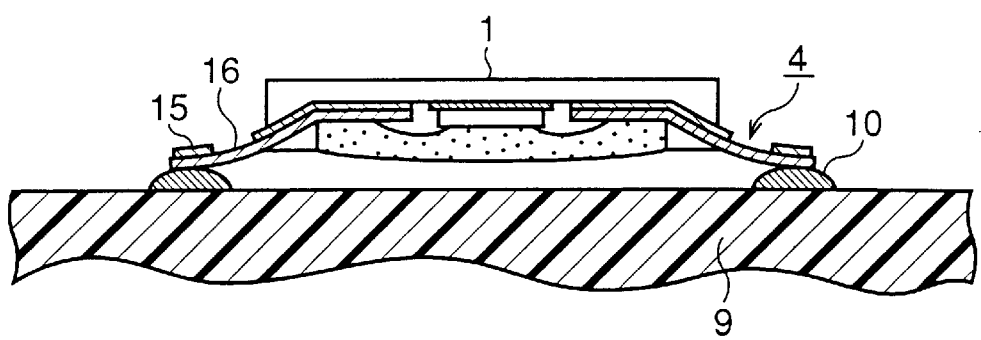
Figure 9C:
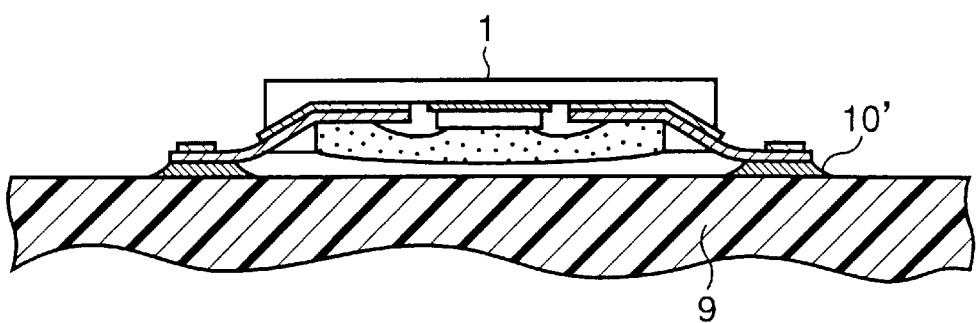

Thereafter, at the sealing process illustrated in FIG. 9C, viscous fluid resin 8 is potted covering at least the LSI 6 and wires 7. The resin 9 is naturally hardened or thermally set to complete the assembly processes. During the potting, the press frame 3 functions as a dam for preventing the resin 8 from flowing. Namely, the resin 8 will not flow over the side wall of the press frame 3. Even if the resin reaches the upper surface of the press frame 3, there is no problem in practice.

Figure 8C:
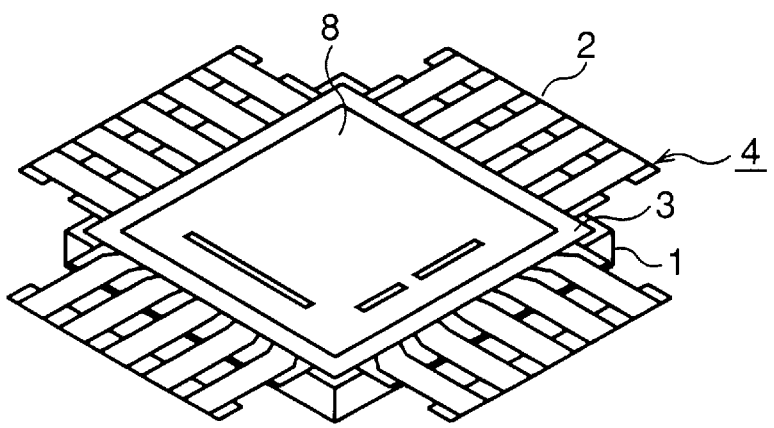

In the processes illustrated in FIGS. 8A to 8C, the interconnection patterns 16 of the package 4 have already been inclined in conformity with the slanted areas 14 and 18. This inclination is not, however, shown in FIGS. 8A to 8C.

As above, the slanted areas 14 and 18 of the radiation plate 1 and the press frame 3 sandwiches the package. Therefore, this state is equivalent to the state after mounting the radiation plate 1 and shaping (bending) the leads before the assembly, reducing the two steps as compared to the assembly process of the second conventional technique. Furthermore, the LSI 6 is directly mounted on the radiation plate 1. As a result, the heat resistance was reduced to about 5° C./W under condition where there was no air movement.

A process of mounting the semiconductor device of the first embodiment of the invention will be described with reference to FIGS. 9A to 9C. First, as illustrated in FIG. 9A, the finished semiconductor device is set in a face-down state and fixedly mounted on the surface of a printed circuit board 9. Solder 10 is coated in advance by a screen printing method or the like on the surface of the printed circuit board 9 at positions corresponding to the outer end portions of the interconnection patterns 16. Although not shown, necessary conductive wiring patterns are formed on the surface of the printed circuit board 9 including the bonding surface of the solder 10.

This semiconductor device is moved in the direction indicated by an arrow 21, after it is correctly positioned. The control means for this movement is not illustrated.

Next, as shown in FIG. 9B, the interconnection patterns 16 abut on the solder 10 on the printed circuit board 9. In this case, since the insulating film 15 and interconnection patterns 16 of the package 4 are flexible, the package 4 is smoothly flexed by the weight of the semiconductor device itself. With this state being retained, the device is heated by IR-reflow or with a VPS system to melt the solder 10, and thereafter the solder is naturally cooled or forcibly cooled with air. In this manner, as illustrated in FIG. 9C, the solder 10 is hardened to form solder 10' which electrically and mechanically connects the interconnection patterns 16 and the conductive wiring patterns.

As above, in this embodiment, the interconnection patterns 16 are flexed by the weight of the semiconductor device itself and pushed against the printed circuit board 9. Therefore, a variation (requirements of ±0.05 mm precision) of flatness of the ends of the interconnection patterns or leads, which is a problem in the QFP using a lead frame, can be absorbed.

Specifically, although the flexed amount of leads changes with the weight of the radiation plate 1, a lead slope angle, and a lead length extended out of the radiation plate 1, the mount is reasonably possible at a flatness precision of ±0.1 to 0.2 mm. If the radiation plate 1 is made of ceramic, Cu/W material, or other such materials, the weight of the radiation plate is large. In such a case, the lead slope angle is required to be set as large as 45 degrees to control the flexed amount to be small. If the radiation plate 1 is made of Al alloy or the like, the weight of the radiation plate is light. Therefore, the lead slope angle is required to be set to about 10 degrees to make it easy to flex the lead. In other words, the slope angle of about 10 degrees to 45 degrees is necessary.

Figure 10A:
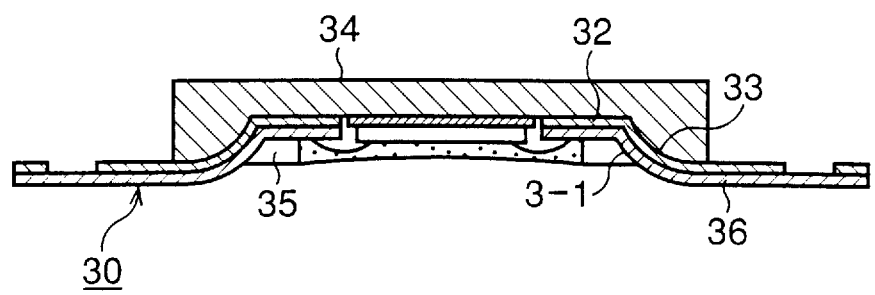
FIGS. 10A and 10B are cross sectional views of a semiconductor device according to a second embodiment and its mount state.

FIG. 10A is a cross sectional view of a semiconductor device according to the second embodiment of the invention. In this embodiment, the shapes of a slanted area 33 of a radiation plate 34 and a slanted area 31 of a press frame 35 and the shape of a package 30 are different from those in the first embodiment. The other elements and assembly method are the same as the first embodiment. Thus, similar description is not repeated here.

Figure 10B:
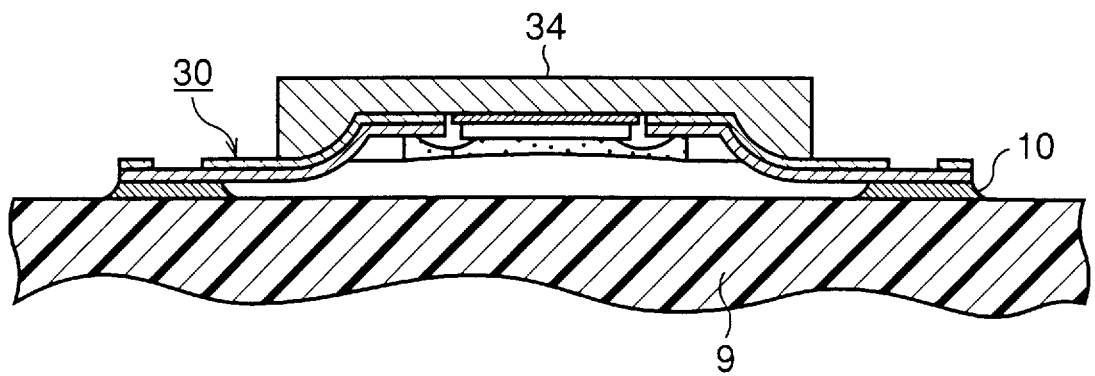

The second embodiment features in that the slanted area 33 of the radiation plate 34 is downward-convex, and its thickness abruptly increases at an area near the flat area 32 and gradually reduces toward the outer periphery. The slanted area 31 of the press frame 35 is upward-concave to engage with the slanted area 33 of the radiation plate 34. With this structure, it is possible to make the interconnection patterns 36 generally parallel to the back surface of the radiation plate 34. Therefore, as illustrated in FIG. 10B, the mount height can be lowered more than that in the first embodiment. Because of this structure, the deflected amount of the package 30 is negligibly small, and so the shape of the slanted area is not necessary to be changed with the weight of the radiation plate 34.

Figure 11A:
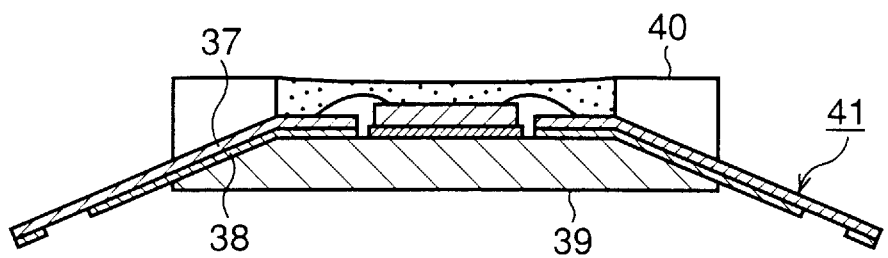
FIGS. 11A and 11B are cross sectional views of a semiconductor device according to a third embodiment and its mount state.

FIG. 11A is a cross sectional view of a semiconductor device according to the third embodiment of the invention. This embodiment is similar to the first embodiment except a press frame 40, a radiation plate 39, and a mount direction. Therefore, only different points will be described here.

The feature of the structure of the third embodiment resides in that as opposed to the first embodiment, the radiation plate 39 is made thin toward the outer periphery to form a slanted area 37.

Figure 11B:
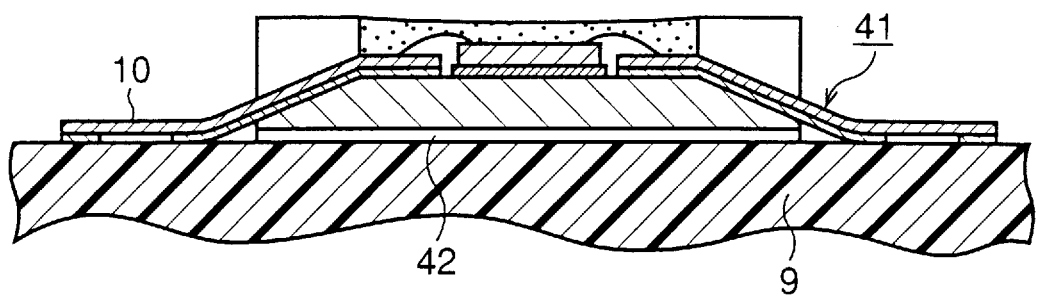

With this structure, for example, as illustrated in FIG. 11B, a face-up mount is possible wherein heat is dissipated toward the printed circuit board 9 via thermally conductive adhesive 42.

A film carrier package 41 is slanted in the direction opposite to that of the first embodiment. Instead, the slanted area may be in the direction opposite to that shown in FIG. 10A.

Figure 12A:
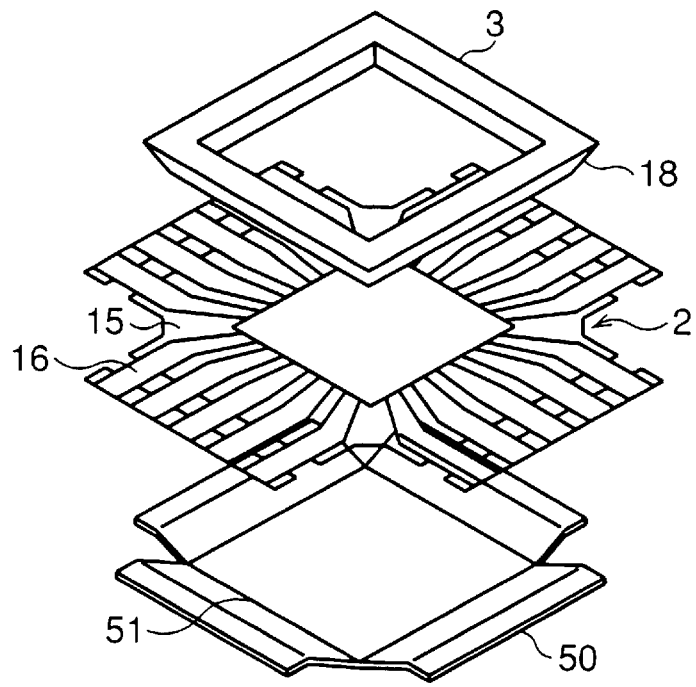
FIGS. 12A and 12B are perspective views showing a film carrier package before and after assemblage according to a fourth embodiment of the invention.

FIG. 12A is a cross sectional view of a film carrier package with a radiation plate according to the fourth embodiment of the invention. This embodiment is similar to the first embodiment except the shape of a radiation plate 50. Therefore, similar description is omitted.

The feature of the structure of the fourth embodiment resides in that the radiation plate is made of a thin metal plate, the four corners thereof are cut out, and the bent portions 51 are formed by bending the metal plate at the same angle for all four sides by using the roots of the four cut-out corners as the bending origin. A film carrier package as shown in FIG. 12B can be assembled by the same method as in the first embodiment.

This structure of the radiation plate 50 features in that both the front and back surfaces are flat over the whole area, the four corners are cut in a square shape, and the four side portions are bent at the same bending angle toward the front surface to form the slanted areas.

The material of the radiation plate 50 is not limited to aluminum and copper, but other materials such as iron and stainless steel may also be used if they are easily bent and have a good heat dissipation effect.

Figure 12B:
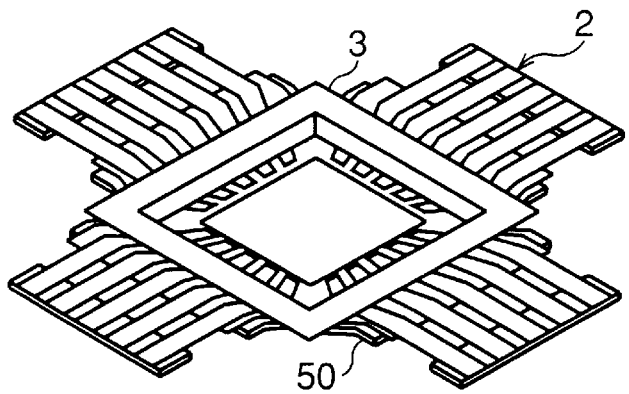

The LSI mount process, wire bonding process and sealing process or the packages shown in FIGS. 12A and 12B are similar to those illustrated in FIGS. 8A to 8C of the first embodiment. Therefore, no drawings are given and only a finished semiconductor device is shown in FIG. 13 as a cross sectional view.

Figure 13:
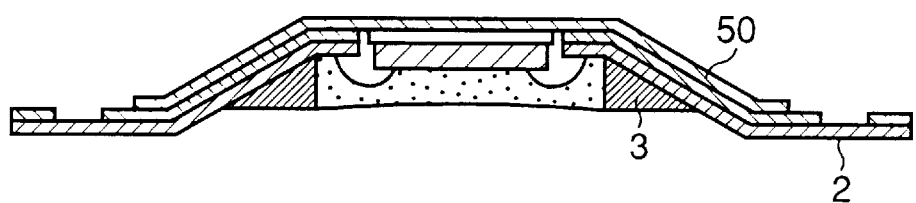
FIG. 13 is a cross sectional view of a semiconductor device of the fourth embodiment.

As shown in FIG. 13, in the fourth embodiment, the four corners of a thin metal plate are punched out and bending is performed by using a metal die to form the radiation plate 50. Therefore, radiation plates can be mass produced at a low cost.

Figure 14:
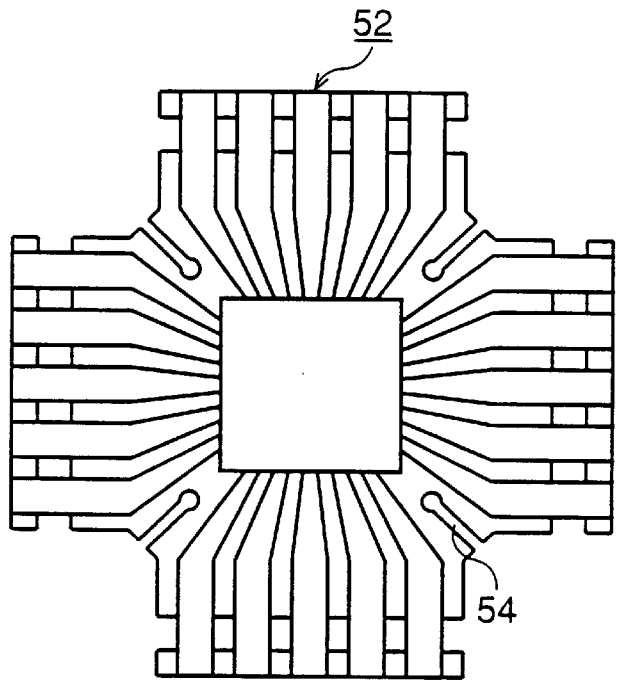
FIG. 14 is a plan view showing an example of the film different from that in each of the first to fourth embodiments.

In addition to the film carrier packages of the first to fourth embodiments, a film carrier package 52 shown in FIG. 14 may be used. Referring to FIG. 14, this package 52 is similar to the packages in the first to fourth embodiments except that slits 54 are formed at the four corners. Therefore, similar description is omitted.

This slit 54 has a width of 0.1 mm to 0.2 mm, the outer end thereof is open, and the inner end terminates at a circular hole. The shapes of the outer and inner ends of this slit 54 may be reversed. This slit 54 has the advantage that high precision interconnection patterns with less positional misalignment are ensured after forming the slanted areas.

Figure 15:
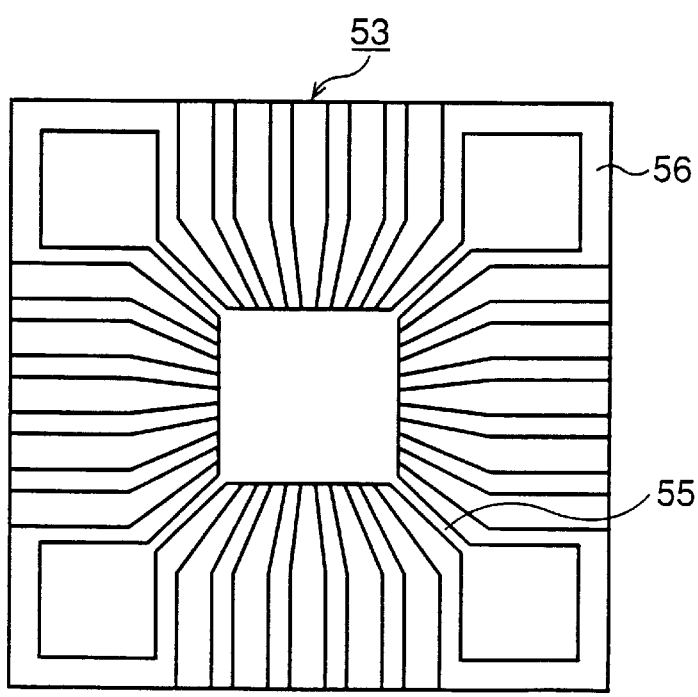
FIG. 15 is a plan view showing another example of the film different from that in each of the first to fourth embodiments.

In addition to the packages of the first to fourth embodiments and the package shown in FIG. 14, a film carrier package 53 shown in FIG. 15 may be used. Referring to FIG. 15, this package 53 is formed with separation portions 55 on diagonal lines, reaching the window. The width of the separation portion is 0.1 mm to 0.2 mm. The outer end of the separation portion 55 terminates at a square coupling portion 56. This coupling portion may be cut and removed if unnecessary at the later process after being assembled with the radiation plate and press frame.

The present invention thus provides means to overcome the problems by directly fixing a semiconductor chip to the radiation plate and sandwiching the film with interconnection patterns between the peripheral area of the radiation plate and the press frame. In addition, the following effects and advantages can be achieved: (1) since the radiation plate mount and lead shaping (bending) have been completed before the assembly process, two steps can be omitted as compared to the assembly process of the second conventional technique or the like; (2) since an LSI is directly mounted on the radiation plate, a heat resistance can be lowered by about 5° C./W under condition where there was no air movement; (3) a mount process is reasonably possible even if a flatness precision of lead ends is about ±0.1 to 0.2 mm, and has a sufficient margin relative to ±0.05 mm of QFP; and (4) by changing the slope angle, slope direction, slope shape (linear or arc), and other conditions of the radiation plate, both the face-up and face-down mounts are possible and the mount height can be controlled as desired.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A semiconductor device comprising:
   a semiconductor chip;
   a radiation plate which has a slanted surface at the peripheral area thereof, said slanted surface being inclined relative to a surface of a generally central area of said radiation plate, and to which said semiconductor chip is directly fixed at the generally central area thereof;
   an insulating film having a window at a portion corresponding to said central area of said radiation plate and being positioned on said radiation plate;
   interconnection patterns fixed on the slanted surface of said radiation plate through said insulating film by using said insulation press frame, said interconnection patterns being connected to said semiconductor chip by wires;
   an insulation press frame having a surface facing and engaging with the slanted surface of said radiation plate; and
   a sealing resin covering said semiconductor chip, said wires and parts of said interconnection patterns.

2. A semiconductor device according to claim 1, wherein said slanted surface is inclined by an angle in a range from ±10 degrees to ±45 degrees.

3. A semiconductor device according to claim 1, wherein said slanted surface has an arc cross section.

4. A semiconductor device according to claim 1, wherein said slanted surface of said radiation plate decreases in its thickness toward the periphery of said radiation plate.

5. A semiconductor device according to claim 1, wherein at least a part of said insulating film has a cut-out portion having a predetermined width along diagonal lines of said radiation plate.

6. A semiconductor device comprising:
   a semiconductor chip;
   a radiation plate to which said semiconductor chip is directly fixed at a generally central area thereof, said radiation plate has a slanted surface at the peripheral area thereof, said slanted surface being inclined relative to the surface of a central area of said radiation plate, and
   said slanted surface of said radiation plate decreases in its thickness toward the periphery of said radiation plate;
   an insulating film having a window at a portion corresponding to said central area of said radiation plate and being positioned on said radiation plate;
   interconnection patterns provided on a surface of said insulating film at a portion except said window, said interconnection patterns being connected to said semiconductor chip by wires;
   an insulation press frame fixed at least to said interconnection patterns, said press frame having a surface facing and engaging with a surface of said radiation plate at a peripheral area thereof; and
   a sealing resin covering said semiconductor chip, said wires and parts of said interconnection patterns.

7. A semiconductor device comprising:
   a semiconductor chip;
   a radiation plate which has a slanted surface at the peripheral area thereof, said slanted surface being inclined relative to a surface of a generally central area of said radiation plate, and to which said semiconductor chip is directly fixed at the generally central area thereof, said slanted surface of said radiation plate decreases in its thickness toward the periphery of said radiation plate;

an insulating film having a window at a portion corresponding to said central area of said radiation plate and being positioned on said radiation plate;

interconnection patterns fixed on the slanted surface of said radiation plate through said insulating film by using said insulation press frame, said interconnection patterns being connected to said semiconductor chip by wires;

an insulation press frame having a surface facing and engaging with the slanted surface of said radiation plate; and a sealing resin covering said semiconductor chip, said wires and parts of said interconnection patterns.

* * * * *